University States Patent US 11,127,612 B2
Huffaker et al. Sep. 21, 2021

(54) TESTING SEMICONDUCTOR DEVICES BASED ON WARPAGE AND ASSOCIATED METHODS

(71) Applicant: Micron Technology, Inc., Boise, ID (US)

(72) Inventors: James D. Huffaker, Boise, ID (US); Kim M. Hartnett, Boise, ID (US); Ajay Raghunathan, Boise, ID (US); Libo Wang, Boise, ID (US); Linmiao Zhang, Singapore (SG); Di Wu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 296 days.

(21) Appl. No.: 15/962,648

(22) Filed: Apr. 25, 2018

(65) Prior Publication Data
US 2019/0333796 A1 Oct. 31, 2019

(51) Int. Cl.
*G06F 17/18* (2006.01)
*G01N 25/72* (2006.01)
*H01L 21/67* (2006.01)
*H01L 21/66* (2006.01)

(52) U.S. Cl.
CPC ....... *H01L 21/67288* (2013.01); *G01N 25/72* (2013.01); *G06F 17/18* (2013.01); *H01L 22/12* (2013.01)

(58) Field of Classification Search
CPC .............. G06F 17/18; H01L 21/67288; H01L 21/67103; H01L 22/12; H01L 22/20; G01N 25/72

USPC ................................................ 702/82; 374/1
See application file for complete search history.

(56) References Cited

U.S. PATENT DOCUMENTS

| 10,620,549 B2 * | 4/2020 | Hulsebos | G03F 9/7011 |
| 2006/0038182 A1 * | 2/2006 | Rogers | H01L 21/02628 257/77 |
| 2007/0221842 A1 * | 9/2007 | Morokuma | G01N 23/2251 250/307 |

(Continued)

OTHER PUBLICATIONS

He et al, "Statistics Pattern Analysis: A New Process Monitoring Framework and its Application to Semiconductor Batch Processes", 2010, AIChE Journal, Jan. 2011 vol. 57, No. 1, p. 107-121 (Year: 2010).*

(Continued)

*Primary Examiner* — Stephanie E Bloss
(74) *Attorney, Agent, or Firm* — Perkins Coie LLP

(57) ABSTRACT

Several embodiments of the present technology are directed to semiconductor devices, and systems and associated methods for treating semiconductor devices based on warpage data. In some embodiments, a method can include heating a plurality of semiconductor devices from a first temperature to a second temperature, and determining warpage data at a plurality of points on the surfaces of the semiconductor devices as they are being heated. The method can further comprise applying a multivariate analysis to the surface warpage data to generate a multivariate statistic for each of the semiconductor devices at various sample temperatures. The multivariate statistics can be used to determine whether the semiconductor devices exceed or fall below a threshold limit.

18 Claims, 17 Drawing Sheets

(56) References Cited

U.S. PATENT DOCUMENTS

| | | | | |
|---|---|---|---|---|
| 2009/0171495 A1* | 7/2009 | Shih | ........................ | H01L 22/12 700/121 |
| 2011/0108838 A1* | 5/2011 | Kageyama | ............ | H04R 19/016 257/49 |
| 2012/0081702 A1* | 4/2012 | Yamada | ............ | G01N 21/95684 356/237.5 |
| 2013/0089935 A1* | 4/2013 | Vukkadala | ............ | G03F 7/70783 438/5 |
| 2014/0114597 A1* | 4/2014 | Chen | .................. | G01N 21/9501 702/84 |
| 2014/0269810 A1* | 9/2014 | Ko | ........................ | G01B 11/306 374/1 |
| 2014/0273294 A1* | 9/2014 | Tsai | .................. | H01L 21/67288 438/7 |
| 2015/0170934 A1* | 6/2015 | Aderhold | ................ | H01L 22/12 438/7 |
| 2015/0371909 A1* | 12/2015 | Bhagavat | ................ | H01L 22/20 438/5 |
| 2016/0190230 A1* | 6/2016 | Krach | .................... | H01L 29/945 257/532 |
| 2017/0242955 A1* | 8/2017 | Ono | ........................ | G06F 30/398 |
| 2019/0187569 A1* | 6/2019 | Ypma | .................. | G03F 7/70633 |
| 2019/0265598 A1* | 8/2019 | Hulsebos | ............ | G03F 7/70633 |

OTHER PUBLICATIONS

Undey et al, "Statistical Monitoring of Multistage, Multiphase Batch Processes", 2002, IEEE Control Systems Magazine, Oct. 2002, p. 40-52 (Year: 2002).*

* cited by examiner

US 11,127,612 B2

TESTING SEMICONDUCTOR DEVICES BASED ON WARPAGE AND ASSOCIATED METHODS

TECHNICAL FIELD

The present disclosure generally relates to semiconductor devices, and more particularly relates to testing semiconductor devices based on warpage.

BACKGROUND

Semiconductor devices are often provided in packages with multiple connected dies and complex surface shapes. In operation, the semiconductor device can experience temperature variations (e.g., during reflow) that result in warpage, and thereby affect attachment of the semiconductor device to other semiconductor devices. For example, any warpage experienced by a package substrate can affect attachment to a printed circuit board, and can be transferred to dies and other devices coupled to the substrate. To anticipate potential issues with warpage (e.g., prior to the semiconductor devices becoming operational), semiconductor devices are often tested using various analytical methods. Depending on results of the testing, semiconductor devices can receive a pass or fail rating, or be exposed to additional testing. One issue associated with the current techniques for detecting potentially faulty semiconductor devices is that analytical methods used for the testing do not often identify enough of the semiconductor devices that may be faulty. In part, this is because complex surface shapes are not effectively represented or characterized by current techniques. In a particular example, complex surface shapes of semiconductor devices having transitions other than just a single concave or convex transition are often not adequately characterized. As a result, some faulty semiconductor devices that should be discarded are instead retained (e.g. sold, packaged, subjected to further manufacturing, etc.), and some semiconductor devices that should be retained are instead discarded. Accordingly, there exists a need to better characterize semiconductor devices to identify issues with warpage.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor manufacturers need to accurately test, qualify, and identify issues with warpage of manufactured semiconductor devices before they become operational. Accordingly, several embodiments of the present technology are directed to systems for testing semiconductor devices. In some embodiments, the systems can include a thermal device for heating a semiconductor device in a controlled manner, and a measurement device for determining surface warpage data of the semiconductor device as it is heated. The system can include a controller or processor operably coupled to the thermal and measurement devices, and which can apply a multivariate statistical analysis to the warpage data to determine whether or not warpage of the semiconductor devices exceeds or falls below a threshold limit. In some embodiments, the multivariate statistical analysis can include a multivariate Hotelling $T^2$ analysis, wherein a Hotelling $T^2$ statistic is generated for the semiconductor device and compared to previously determined baseline levels for other similar or identical devices. In addition to or in lieu of the foregoing, the system can also characterize a semiconductor device, based on the warpage data determined by the measurement device. As such, the system may characterize a semiconductor device according to a set of classifications. Once a semiconductor device has been given a multivariate statistic and/or characterized according to a classification, the decision to pass, fail, or perform further testing of the semiconductor device can be more easily made.

Figure 1:
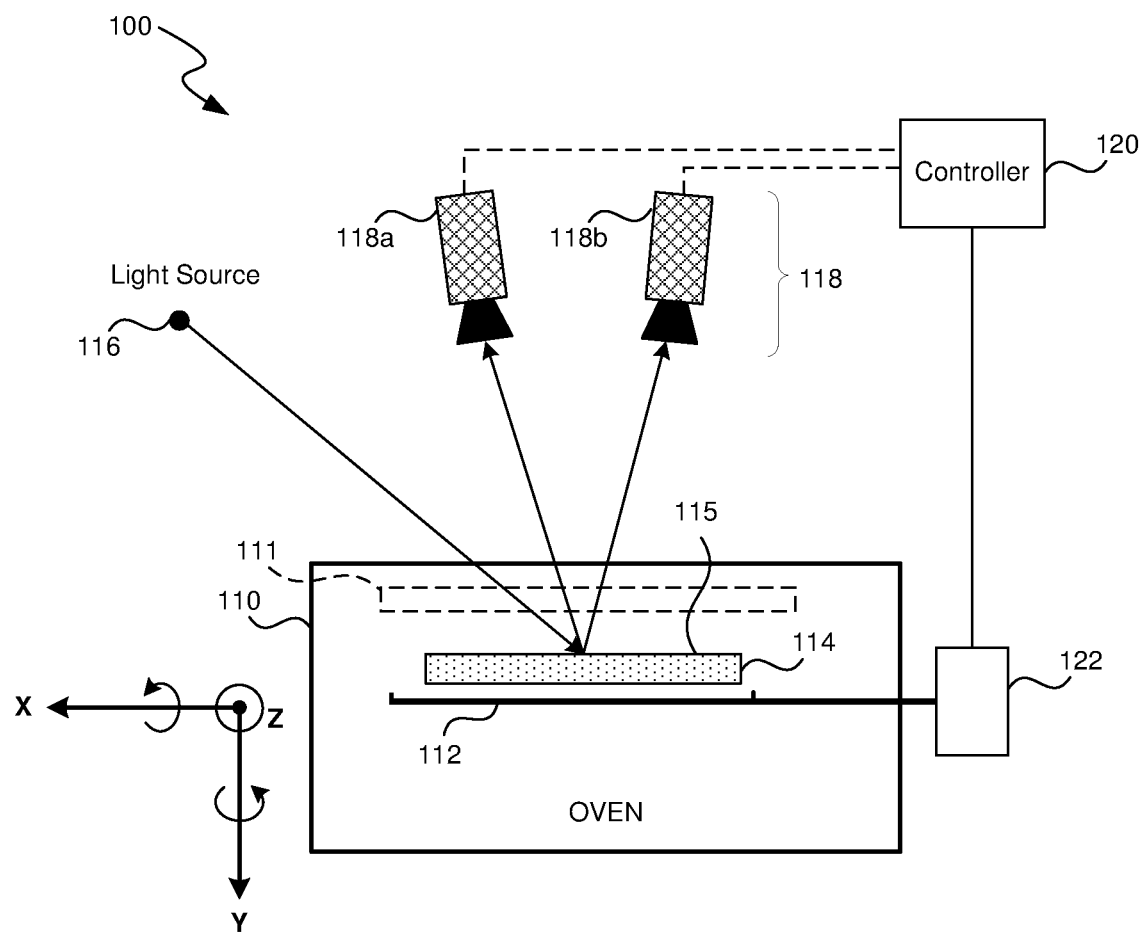
FIG. 1 is a schematic block diagram of a system for testing warpage of a semiconductor device in accordance with embodiments of the present technology.

FIG. 1 is a schematic block diagram of a system 100 for testing warpage of a surface 115 of one or more semiconductor devices 114 (e.g., a substrate, printed circuit board, semiconductor die, redistribution structure, semiconductor packages, semiconductor assemblies, etc.). As shown in FIG. 1, the system 100 can include a thermal device 110 (e.g., an oven, chamber, processing system, etc.) for heating and/or cooling the semiconductor device 114 placed therein, a light source 116 directed at least partially toward the semiconductor device 114 in the thermal device 110, and one or more measurement devices 118a, b (collectively referred to as "measurement device 118") positioned over the thermal device 110. The thermal device 110 can include a movable support piece 112 supporting the semiconductor device 114 and operably coupled to an adjustment device 122 (e.g., a servo-motor). The adjustment device 122 can move the support piece 112 (and thus the semiconductor device 114) in an x-direction (e.g., horizontally toward and/or away from the adjustment device), a y-direction (e.g., vertically toward and/or away from the measurement device 118), a z-direction (e.g., into and/or out of the plane of FIG. 1), a first rotatable direction around the x-axis, a second rotatable direction around the y-axis, and a third rotatable direction around the z-axis.

The system 100 can further comprise a controller 120 (e.g., a processor) operably coupled to the measurement device 118 and the adjustment device 122. As such, in some embodiments, the controller 120 can adjust the position of the support piece 112 such that light from the light source 116 can be directed at relevant portions of the surface 115 of the semiconductor device 114, and/or the relevant portions of the surface 115 can be measured by the measurement device 118. Additionally, in some embodiments, the controller 120 can cause the measurement device 118 to determine displacements of the surface 115 as the thermal device 110 and semiconductor device 114 are heated and/or cooled. In such an embodiment, the measurement device 118 can determine warpage of the semiconductor device 114 over a range of temperatures. The controller 120 can issue computer-executable instructions, including routines executed by a programmable computer. The controller 120 may, for example, also include a combination of supervisory control and data acquisition (SCADA) systems, distributed control systems (DCS), programmable logic controllers (PLC), control devices, and processors configured to process computer-executable instructions. Those skilled in the relevant art will appreciate that the technology can be practiced on computer systems, or in a data processor that is specifically programmed, configured or constructed to perform one or more of the computer-executable instructions described below. Accordingly, the terms "controller" as generally used herein refer to any mechanical, electrical or electro-mechanical device, including but not limited to a data processor.

The measurement device 118 can include a camera, imaging system, or other optical device configured and/or used to determine distances from the measurement devices 118 to relevant portions of the surface 115 of the semiconductor device 114. The measurement device 118 can measure in-plane and out-of-place displacements of the surface 115 of the semiconductor device 114. For example, in some embodiments, such as the embodiment shown in FIG. 1, measurement devices 118a and 118b view the sample from different angles and can use triangulation to determine displacement of a point on the surface 115 relative to an adjacent point on the surface 115. In addition to or in lieu of the foregoing, light source 116 can direct a pattern of light over the surface 115, and the measurement devices 118a and 118b can use pattern recognition of the light to identify points on the surface 115. The controller 120 can cause the support piece 112 to be stepped in different directions to determine surface displacements until all of the relevant portions of the surface 115 are captured.

In some embodiments, the system 100 can measure displacements of the surface 115 using other arrangements. For example, the system 100 may include a single measurement device and direct fringe patterns, via the light source 116, toward the surface 115. The expected fringe pattern will be distorted by non-flat portions of the surface 115, thereby allowing displacements and varying heights on the surface 115 to be identified by the measurement device 118. In yet other embodiments, the system may include a grating 111, and use shadows and geometric interference to measure displacements. In such an embodiment, light applied via the light source 116 and toward the grating 111 will create shadows over the surface 115, which can then be used to measure vertical displacements at different points of the surface 115. A person of ordinary skill in the relevant art will appreciate that still other embodiments utilizing the present technology may be performed to achieve similar results as described herein.

Figure 2:
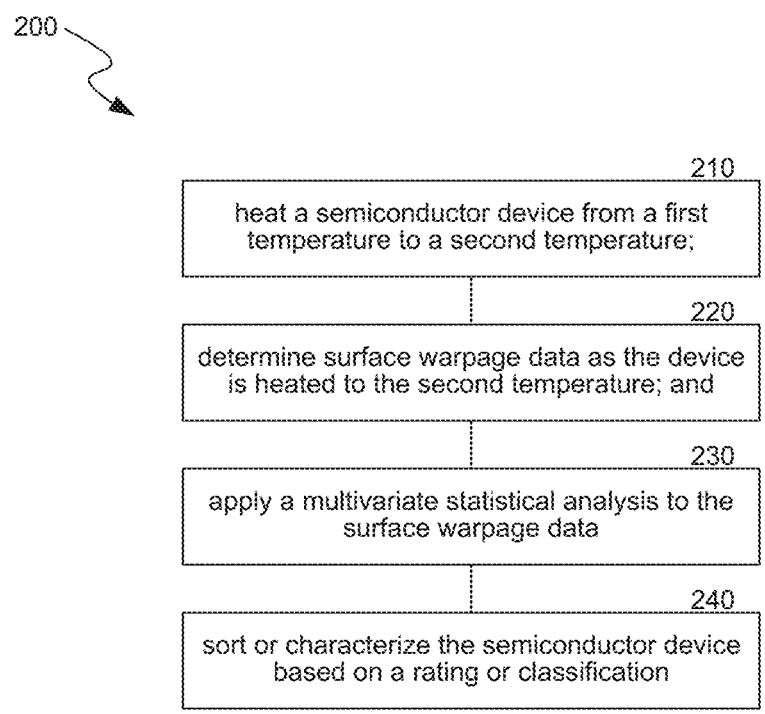
FIG. 2 is a flow diagram illustrating a process for testing warpage of a semiconductor device in accordance with embodiments of the present technology.

FIG. 2 is a flow diagram illustrating a process 200 for testing warpage of semiconductor devices. Process portion 210 includes heating or cooling a semiconductor device from a first temperature to a second temperature. In some embodiments, heating or cooling the semiconductor device can take place in a thermal device (e.g., thermal device 110) and be controlled by a controller (e.g., controller 120). The first temperature can correspond to room temperature and be within a range from about 15° C. to about 30° C., and the second temperature can correspond to reflow temperatures and be within a range from about 200° C. to about 300° C. In some embodiments, the first and second temperatures may be higher or lower than stated herein, depending on the targeted end application of the semiconductor device. In some embodiments, a plurality of semiconductor devices, as opposed to just a single semiconductor device may be heated at the same time.

Process portion 220 includes determining surface warpage data at, for example, a plurality of points on the surface of the semiconductor device, as the device is heated to the second temperature. As the semiconductor device is adjusted (e.g., heated or cooled), warpage occurs in different magnitudes across the semiconductor device. As such, the warpage at various points on the surface of the semiconductor device can be measured at sample temperatures at and/or between the first and second temperatures. In some embodiments, the semiconductor device is heated (or cooled) to a given temperature, and measurements are taken at the given temperature. The semiconductor device can then be further heated (or cooled) to a different temperature, and additional measurements can be taken. This process can be repeated at multiple temperatures until warpage data over a temperature range is obtained. Sample temperatures can be taken at, for example, every 10-15° C. between the first and second temperatures. In some embodiments, the warpage data includes measured displacements at points on the surface of the semiconductor device. Measured displacements can be taken at each point on the surface of the semiconductor device until the entire surface or a portion of the surface is measured. This process can be repeated for each sample temperature at and/or between the first and second temperatures, and for each point on the surface of the semiconductor device. In some embodiments, a grid pattern may be applied to the semiconductor device to define the points where measured displacements are determined. An advantage of this methodology is that other semiconductor devices having similar surface shapes (e.g., identical parts manufactured in a common batch) can use the same grid pattern, and corresponding points can then be compared to those of other semiconductor devices. The displacements of particular points on the surface can be determined according to the methods previously described with reference to FIG. 1. Additionally, as explained in further detail below with reference to FIGS. 4A-4I, the warpage data determined in process portion 220 can be used to characterize individual semiconductor devices into one or more of a plurality of different classifications (e.g., upward twist, downward twist, complex/flat, y-pipe, x-pipe, bowl, dome, x-saddle, y-saddle, etc.).

Process portion 230 includes applying a multivariate statistical analysis to warpage data (e.g., warpage data determined from process portion 220). The multivariate statistical analysis, as opposed to its univariate counterpart, is used at least in part so that the measured displacements at each of the points on the surface of the semiconductor device can be considered collaboratively and compared to the corresponding points from other semiconductor devices. In some embodiments, the multivariate statistical analysis can include a multivariate Hotelling $T^2$ statistic, which compares warpage surface measurements against a baseline mean or against a reference flat plane at each of the sample temperatures. Stated another way, the Hotelling $T^2$ analysis can consider warpage data for an individual semiconductor device at each measured point and for each sample temperature, and generates a matrix with these values. The matrix is then used to generate a $T^2$ statistic (e.g., one or more values) for the semiconductor device by comparing the warpage data to a corresponding mean value of other semiconductor devices. In some embodiments, the Hotelling $T^2$ statistic can be defined per Equation 1:

$$T^2 = (x-\bar{x})'s^{-1}(x-\bar{x}); \quad \text{Equation 1:}$$

where
- x is the vector of the warpage data from a semiconductor device,
- $\bar{x}$ is the mean of corresponding warpage data from other semiconductor devices or a baseline value,
- ' denotes transpose operation, and
- $s^{-1}$ is the inverse matrix of the covariance of the warpage data from other semiconductor devices.

In some embodiments, the multivariate analysis using the Hotelling $T^2$ method may apply a principle component analysis to minimize the effects of noise expressed in the Hotelling $T^2$ statistic. Stated otherwise, since the warpage measurements (e.g., pixel level measurements) are spatially highly correlated, their dimensionality is reduced using a principle components analysis. For example, the $T^2$ statistic may only consider the warpage measurements (e.g., components) that account for at least a majority of the variation in the warpage measurements. In some embodiments, the $T^2$ statistic may only select the principle components that account for 90% of the variation. In other embodiments, the $T^2$ statistic can be higher (e.g., 95% or 98%) or lower (e.g., 85% or 75%), depending on the manufacturer's need. In some embodiments, the principle components analysis can use an orthogonal transformation to convert the correlated pixel level measurements into a reduced set of linearly uncorrelated variables (i.e., principle components). Once the multivariate Hotelling $T^2$ statistic is calculated using the selected principal components, the results can be plotted on a $T^2$ Control Chart.

Using the Hotelling $T^2$ statistic allows a manufacturer to compare warpage data for each semiconductor device to other semiconductor devices at multiple temperatures. In some embodiments, applying the multivariate statistical analysis to the surface warpage data is performed to determine whether warpage of the semiconductor device exceeds or falls below a threshold limit. In some embodiments, the threshold limit can be an upper threshold limit or upper control limit (UCL) based on the number of observations (e.g., the number of semiconductor devices tested) and the applicable statistical distribution as shown in Equations 2 and 3, wherein Equation 2 is used for initial exploratory analysis and Equation 3 is used for real-time monitoring.

$$UCL = \frac{(m-1)^2}{m} B_{\alpha; \frac{p}{2}, \frac{(m-p-1)}{2}} \quad \text{Equation 2}$$

$$UCL = \frac{p(m+1)(m-1)}{m^2 - mp} F_{\alpha,(p,m-p)} \quad \text{Equation 3}$$

where
- m is the number of observations (e.g., parts tested and used in the Hotelling $T^2$ calculation), and
- B is a percent point function of the Beta distribution, with p being the number of variables and α being the significance level.

Once determined, the threshold limit can be compared to the Hotelling $T^2$ statistic generated for each semiconductor device to determine whether the semiconductor device receives a pass, fail or other designation.

Proceeding to process portion 240, the statistical analysis described above can be used to make further determinations about the semiconductor device. For example, based on the surface warpage data and/or the multivariate statistical analysis, the semiconductor device can be sorted or characterized based on a rating (e.g., pass, fail, needs further testing, etc.) or a classification (e.g., upward twist, downward twist, complex/flat, y-pipe positive, y-pipe negative, x-pipe positive, x-pipe negative, bowl, dome, x-saddle, y-saddle, etc.). In some embodiments, the rating of the semiconductor is based on whether the multivariate statistic exceeds the threshold limit (e.g., the UCL).

Figure 3A:
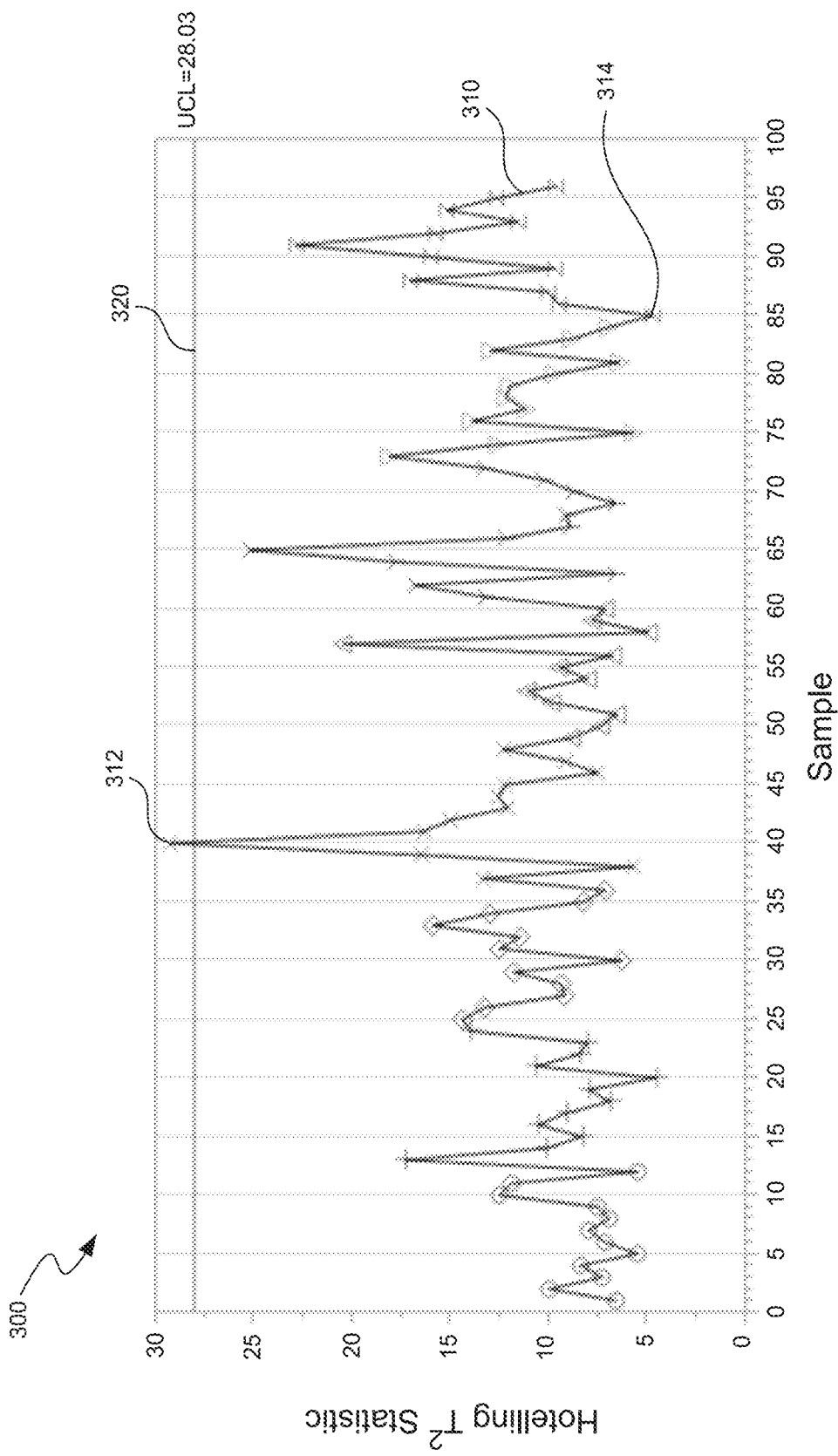
FIGS. 3A-3D are plots illustrating surface warpage data for a plurality of semiconductor devices in accordance with embodiments of the present technology.

FIGS. 3A-3D are plots illustrating examples of surface warpage data analysis for a plurality of semiconductor devices. FIG. 3A shows an example of a control chart 300 applying a multivariate statistical analysis to a plurality of semiconductor devices at a sample temperature (e.g., 80° C.). The control chart 300 includes an x-axis with different samples (e.g., semiconductor devices), a y-axis with the Hotelling $T^2$ statistic corresponding to warpage data for each of the samples, and a threshold line 320 corresponding to a UCL for the batch of samples tested. As shown in FIG. 3A, 96 different samples were tested (e.g., in the thermal device 110) and a Hotelling $T^2$ statistic was generated for each sample, as shown by line 310. In this particular example, part 40 had a Hotelling $T^2$ statistic value 312 that was above the UCL for this sample size. As such, part 40 may be either discarded or need to be retested. Notably, the control chart 300 corresponds to a single temperature, and similar control charts can be viewed at the other sample temperatures to determine, for example, other samples that have a Hotelling $T^2$ statistic above the UCL. Additionally, the control charts for the other sample temperatures can be used to understand whether a particular sample (e.g., sample 40) exceeded the UCL at multiple temperatures or only at a single temperature, which can help determine the accuracy of each control chart.

Figure 3B:
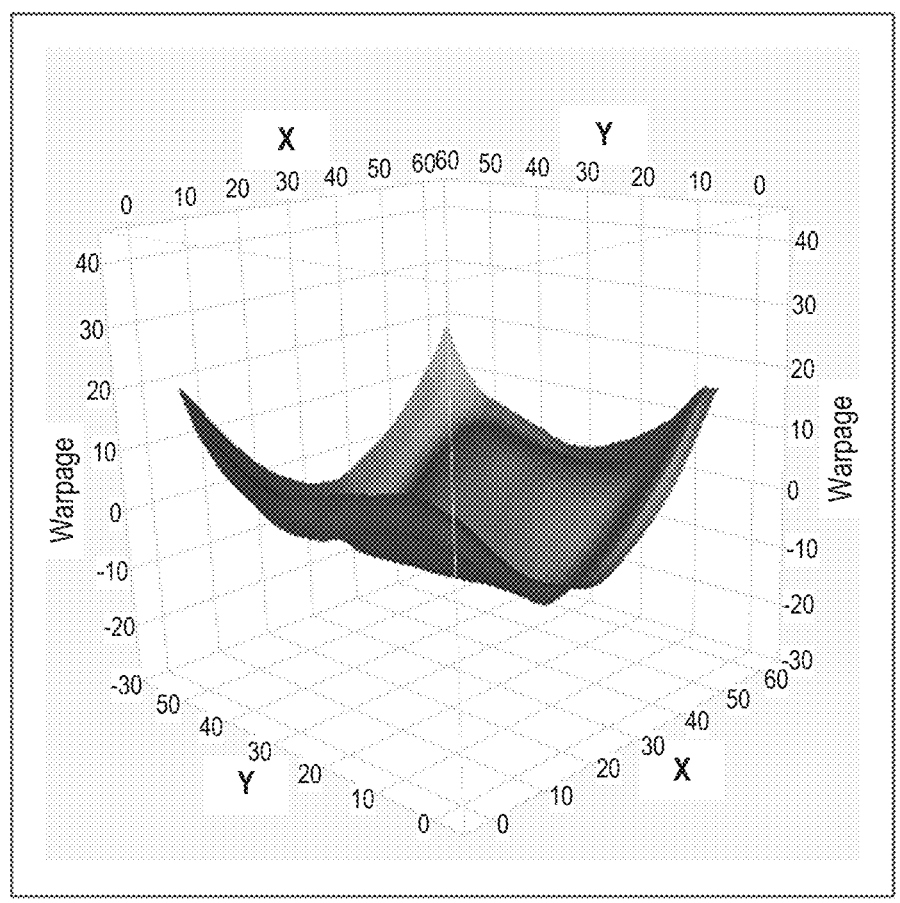
Figure 3C:
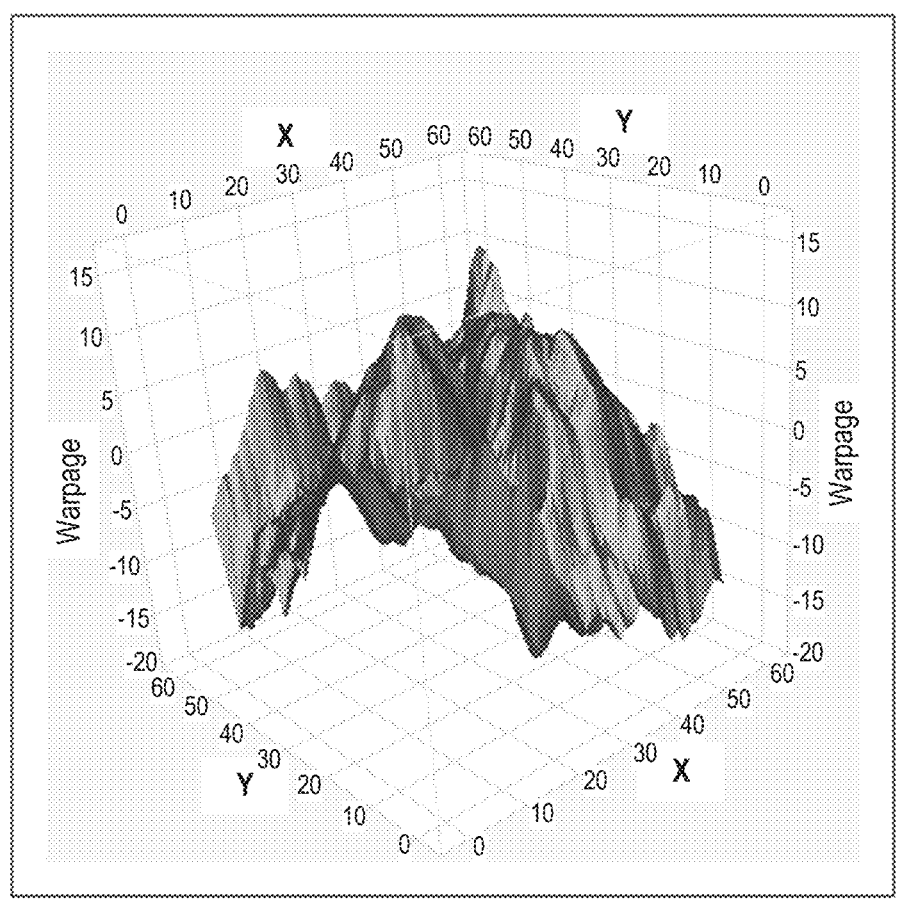
Figure 3D:
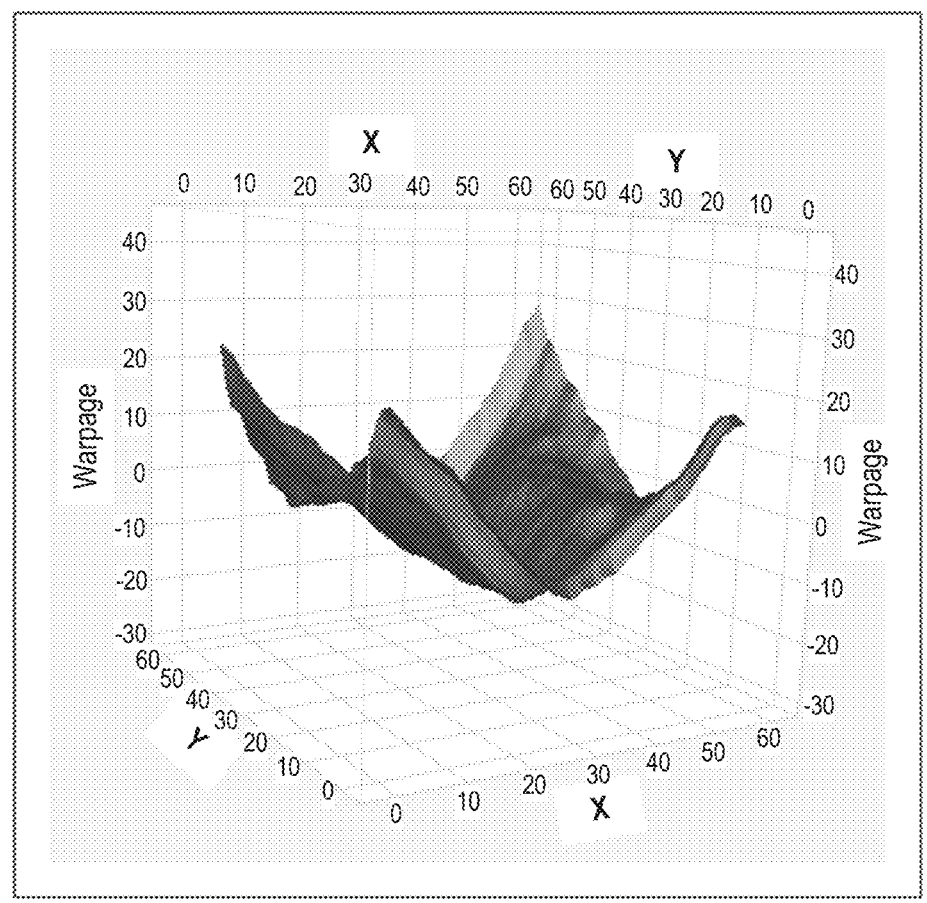

FIGS. 3B-3D are additional plots corresponding to the data shown in control chart 300. FIG. 3B is a composite surface plot of the 96 samples tested for a single temperature, FIG. 3C is a surface plot of sample 40, which was above the UCL, and FIG. 3D is a surface plot of sample 85, which had the lowest Hotelling $T^2$ statistic for the batch. As shown in FIGS. 3B-3D, the warpage of the surface plot of sample 85 (FIG. 3D) is more similar to warpage of the composite surface plot (FIG. 3B), than the warpage of the surface plot of sample 40 (FIG. 3C).

FIGS. 4A-4I are plots illustrating different classifications of surface warpage data in accordance with embodiments of the present technology. As previously mentioned, the warpage data (e.g., the warpage data determined in process portion 220) can be used to characterize individual semiconductor devices into a plurality of different classifications. The classifications can identify transitions between positive shape directions and negative ones. The classifications can be generated based on clustering of n-th order polynomial (e.g., 2nd, 3rd, 4th or 5th order polynomials) fitted coefficients. These classifications can ultimately be used, for example, to identify and remediate the cause of warpage of a semiconductor device, to make more effective decisions as to whether to discard a semiconductor device (e.g., for having a particular classification), or in subsequent processing steps addressing the identified classification of warpage.

A point of transition, as indicated by warpage data, can be determined by fitting the warpage data by a n-th order polynomial. The fitting can provide coefficients of an n-th order polynomial which, along with surface dimensions of the semiconductor device, can then be used to gauge whether a transition has occurred. For example, Equation 3 (the $2^{nd}$ order polynomial) can be fitted to warpage data and used to identify transitions.

$$Z=a+bx+cy+dxy+ex^2+fy^2; \quad \text{Equation 3:}$$

where d, e, f each correspond to the $2^{nd}$ order coefficients, and x, y correspond to surface dimensions of the semiconductor device.

Based on these determined coefficients, transition points indicated by the warpage data can be identified and used to characterize semiconductor devices according to the classifications shown in FIGS. 4A-4I. These classifications can include: upward twist, downward twist, complex/flat, y-pipe, x-pipe, bowl, dome, x-saddle and y-saddle. Each of FIGS. 4A-4I includes a plot having x and y dimensions (e.g., pixels), and describes one of these classifications.

Figure 4A:
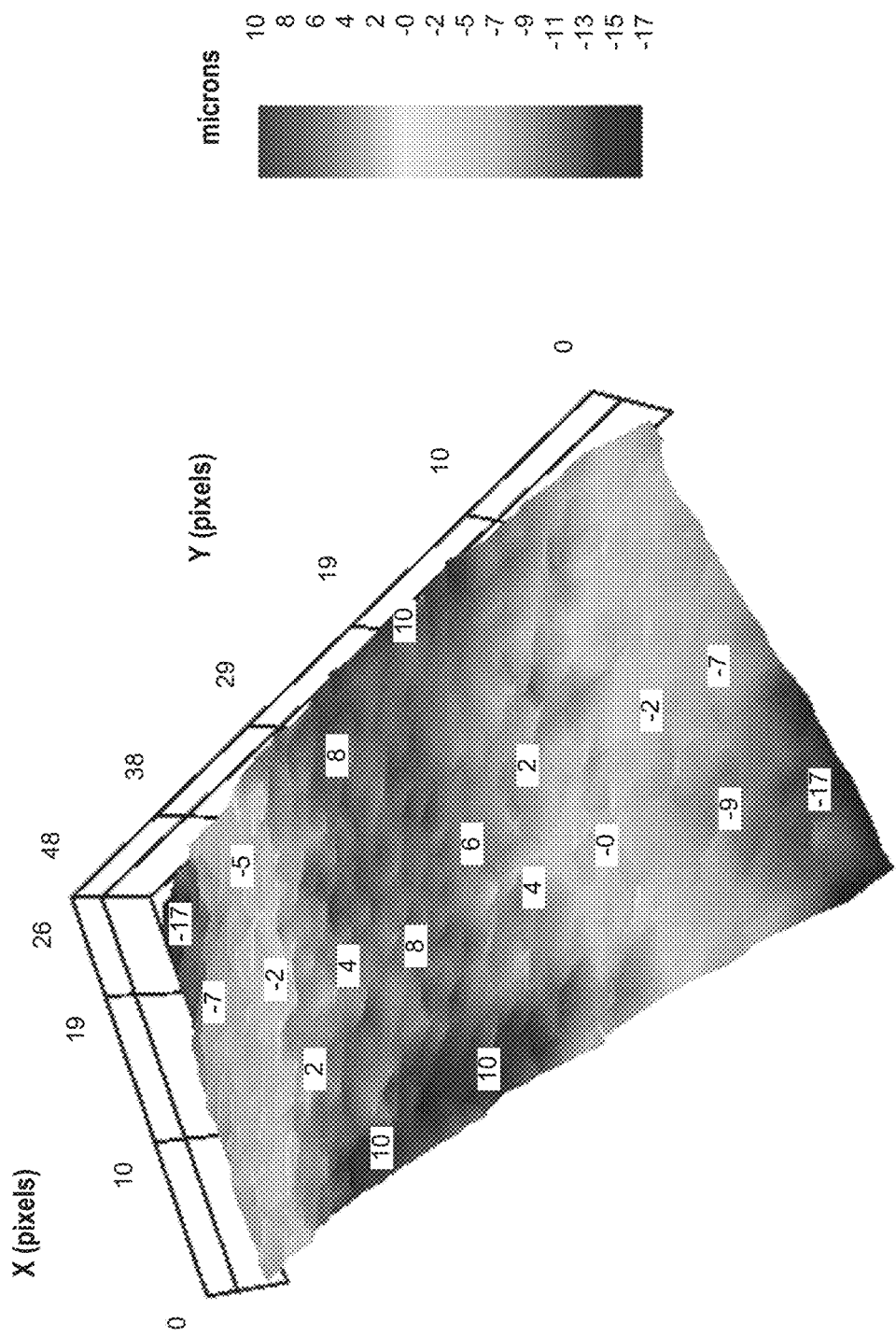
FIGS. 4A-4K are plots illustrating different characterizations of surface warpage data in accordance with embodiments of the present technology.

FIG. 4A includes a plot that illustrates an upward twist classification. The upward twist is characterized by the positive slope direction spanning across the center region of the x- and y-axis and the negative slope direction at opposing corners (e.g., the upper right corner and lower left corner). The upward twist classification can be characterized according to Equation 4:

$$\frac{\text{ABS}(dmn)}{\text{ABS}(em^2)+\text{ABS}(fn^2)} > 0.35 \text{ and } d>0; \quad \text{Equation 4}$$

where m, n correspond to values of x, y dimensions, respectively.

Figure 4B:
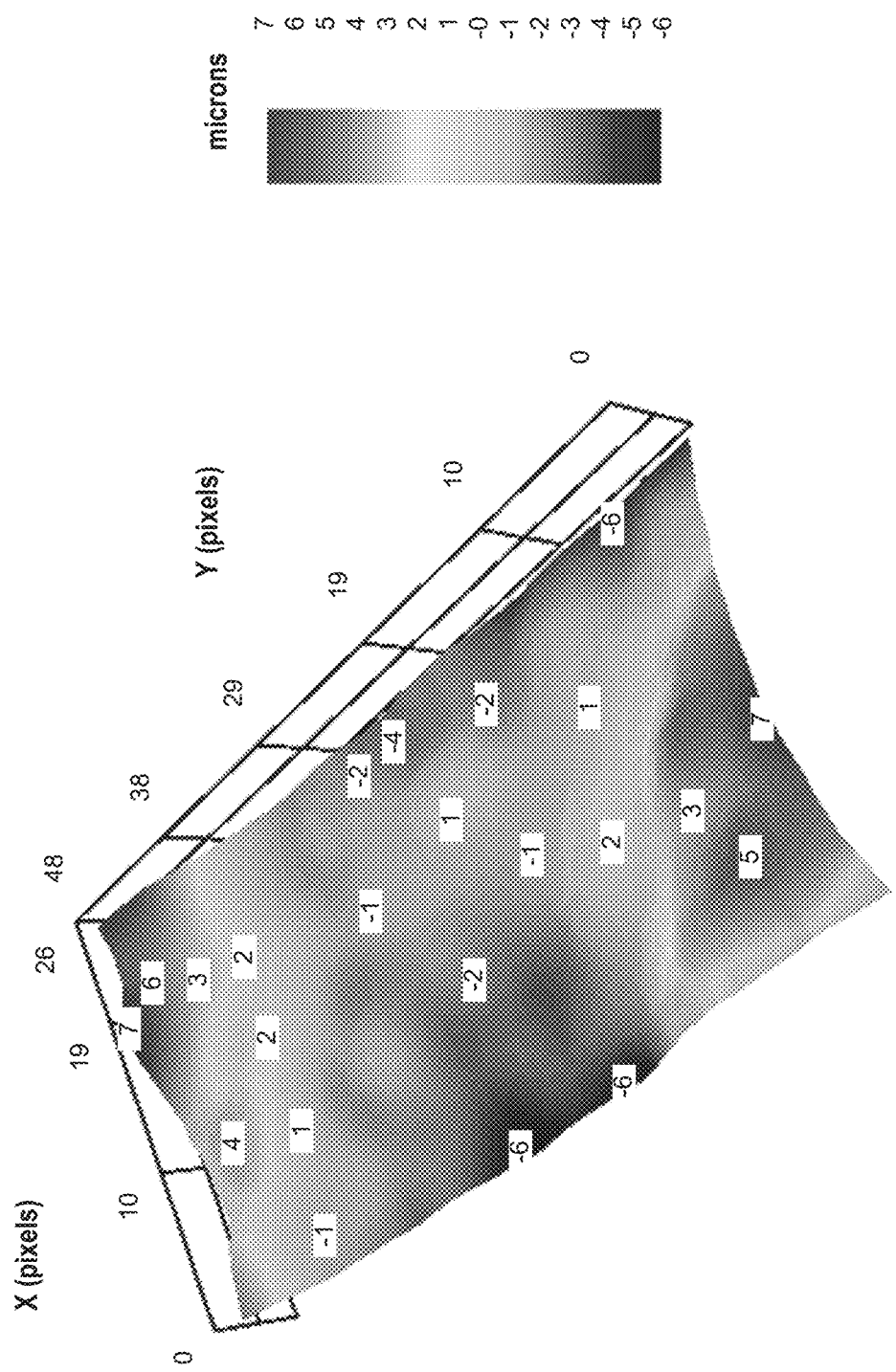

FIG. 4B includes a plot that illustrates a downward twist classification. As shown in FIG. 4B, the downward twist is generally opposite the upward twist classification, and is characterized by the negative slope direction across the center region of the x- and y-axis and the positive slope direction at opposing corners (e.g., the upper right corner and lower left corner). The downward twist classification can be characterized according to Equation 5:

$$\frac{\text{ABS}(dmn)}{\text{ABS}(em^2)+\text{ABS}(fn^2)} > 0.35 \text{ and } d>0 \quad \text{Equation 5}$$

where m, n correspond to values of x, y dimensions, respectively.

Figure 4C:
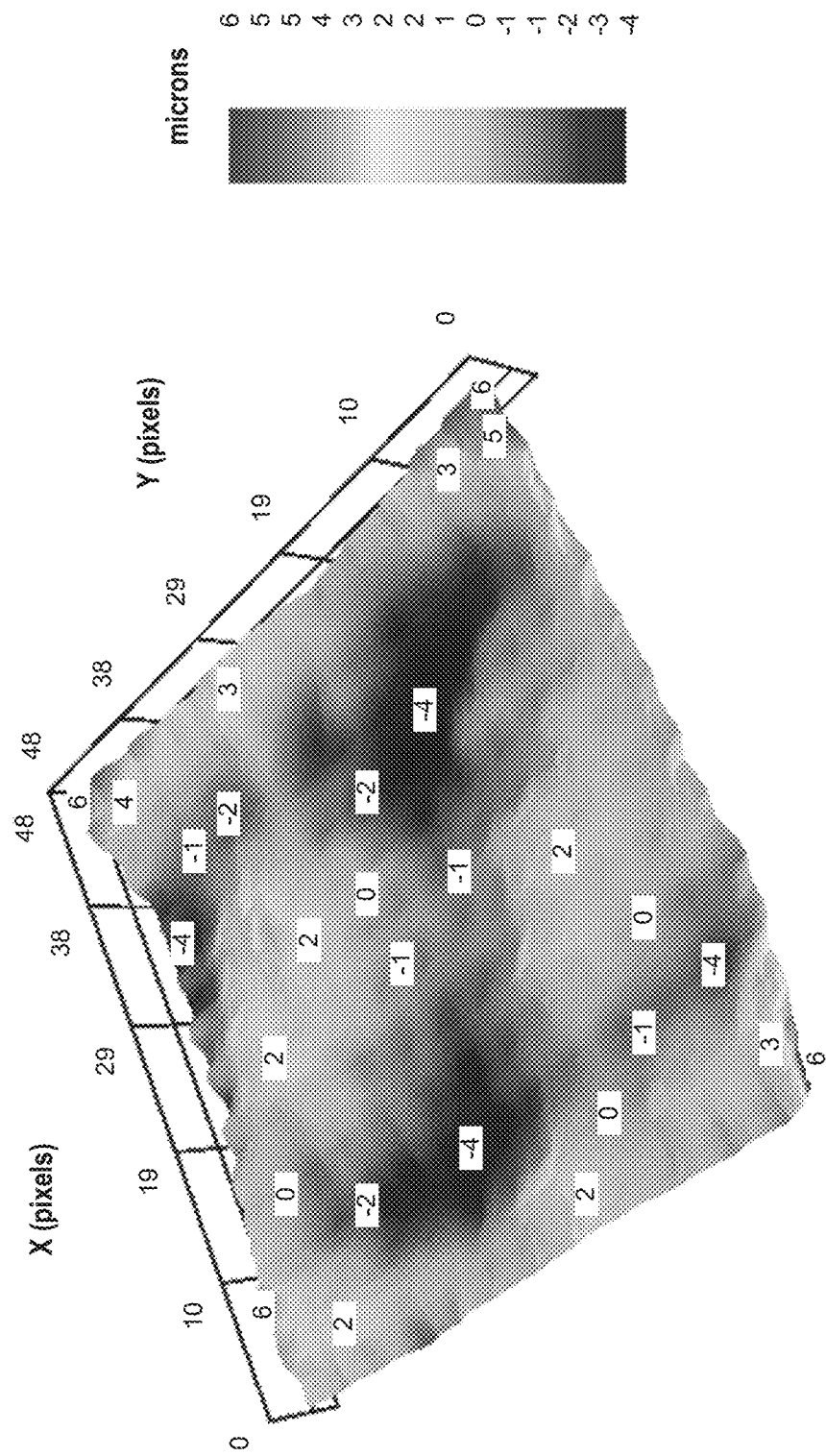

FIG. 4C includes a plot that illustrates a complex/flat classification. The complex/flat shape is characterized by the generally flat shape and the lack of any extreme warpage (e.g., magnitude over 10). For example, as shown in FIG. 4C, the complex/flat shape includes a maximum warpage difference (e.g., the difference between the most positive and most negative warpage measurements) of 10. The complex/flat classification can be characterized according to Equation 6:

$$\frac{\text{ABS}(em^2)+\text{ABS}(fn^2)}{4*\text{coplanarity}} \leq 0.25; \quad \text{Equation 6}$$

where m, n correspond to values of x, y dimensions, respectively, and coplanarity equals the difference between the most positive and most negative warpage measurement values.

Figure 4D:
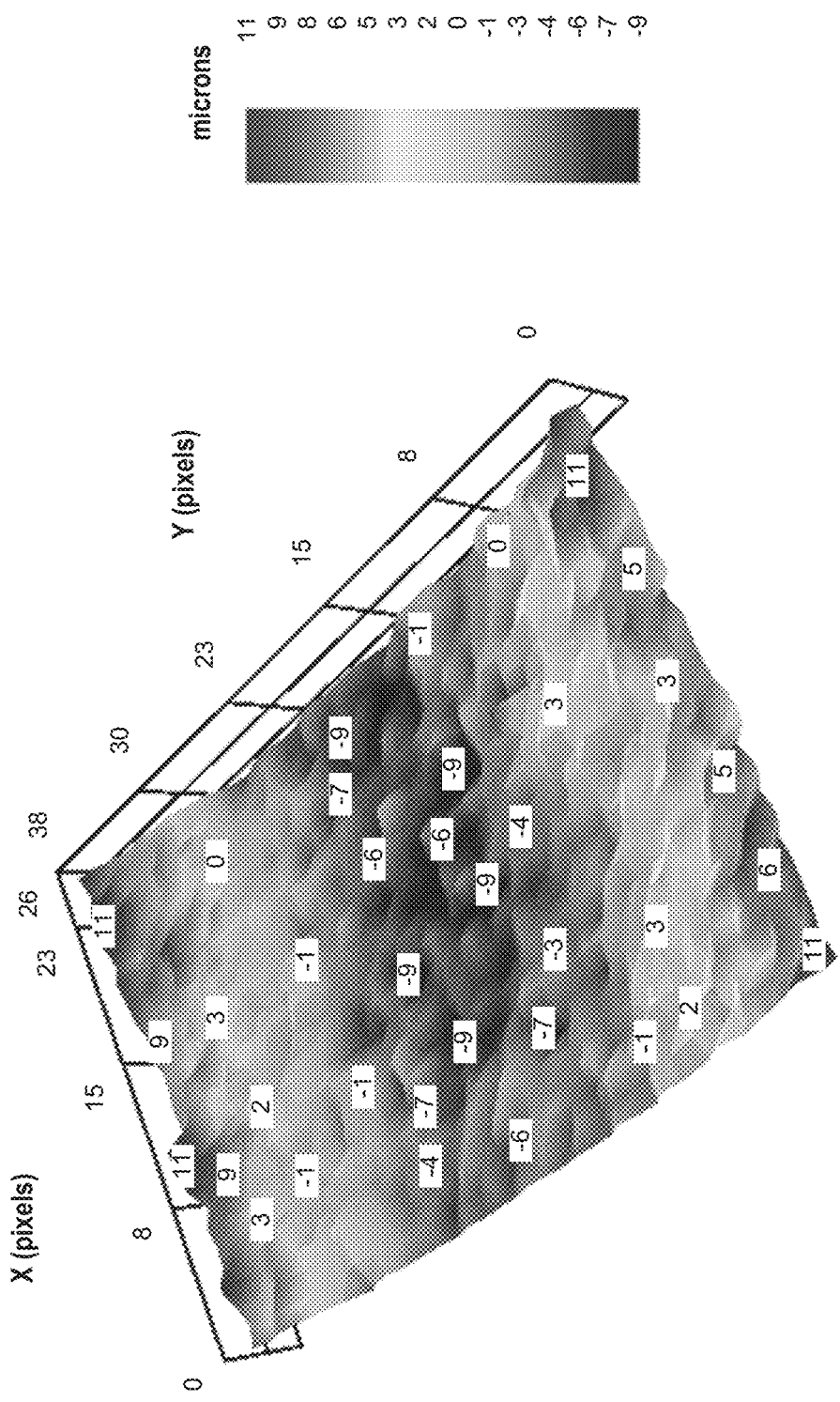

FIG. 4D includes a plot that illustrates a x-pipe negative classification. The x-pipe negative classification is characterized by the negative slope direction along the center region of the x-axis and the positive slope direction along both ends of the x-axis outwardly from the negative slope direction of the center region.

Figure 4E:
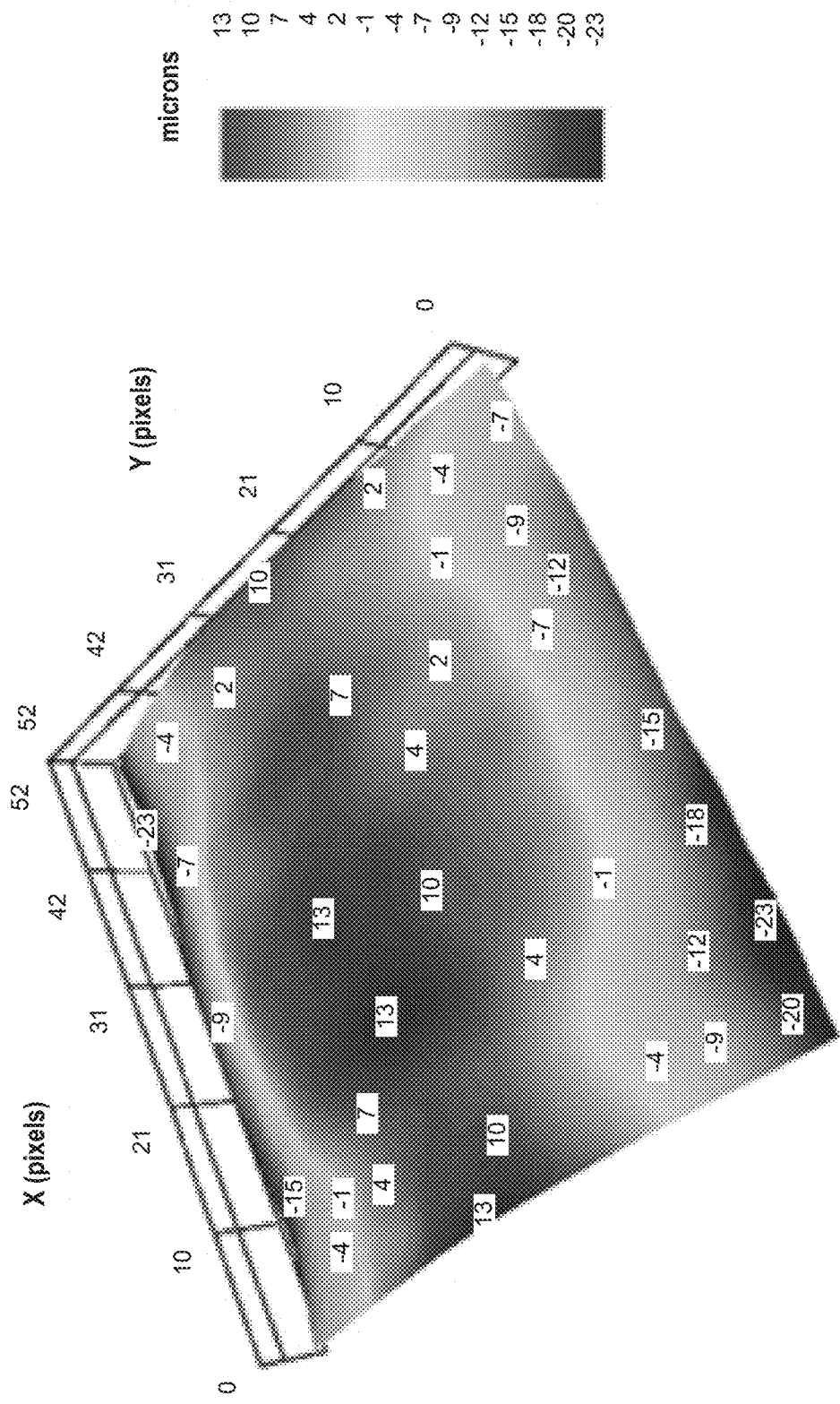

FIG. 4E includes a plot that illustrates a x-pipe positive classification. The x-pipe positive classification is characterized by the positive slope direction along the center region of the x-axis and the negative slope direction along both ends of the x-axis outwardly from the positive slope direction of the center region. The x-pipe positive classification and the x-pipe negative classification can be characterized according to Equation 7, with positive or negative orientation being determined visually:

$$\text{ABS}\left(\frac{em^{1.5}}{fn^{1.5}}\right) \geq 2.5; \quad \text{Equation 7}$$

where m, n correspond to values of x, y dimensions, respectively.

Figure 4F:
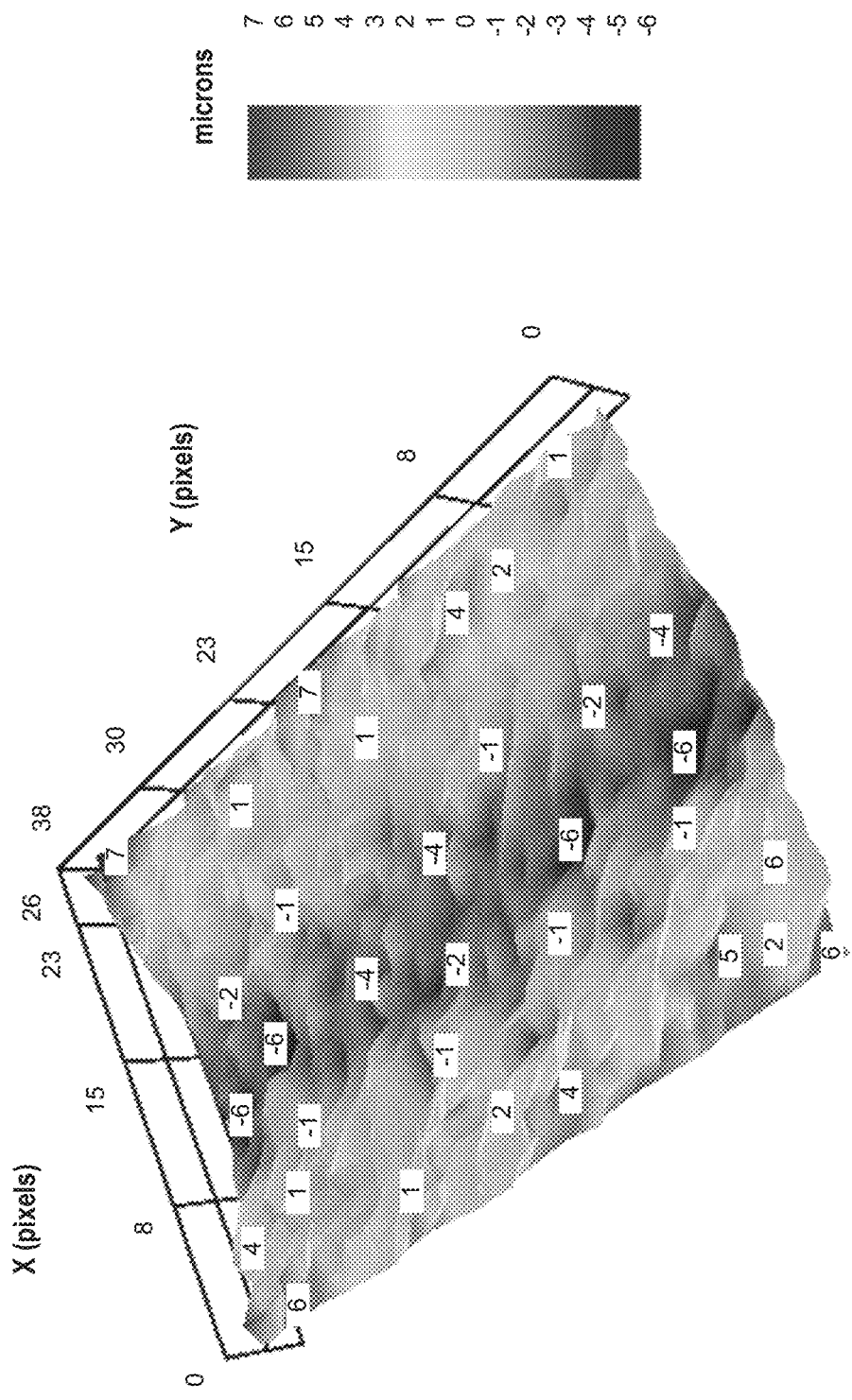

FIG. 4F includes a plot that illustrates a y-pipe negative classification. The y-pipe negative classification is characterized by the negative slope direction along the center region of the y-axis and the positive slope direction along both ends of the y-axis outwardly from the negative slope direction of the center region.

Figure 4G:
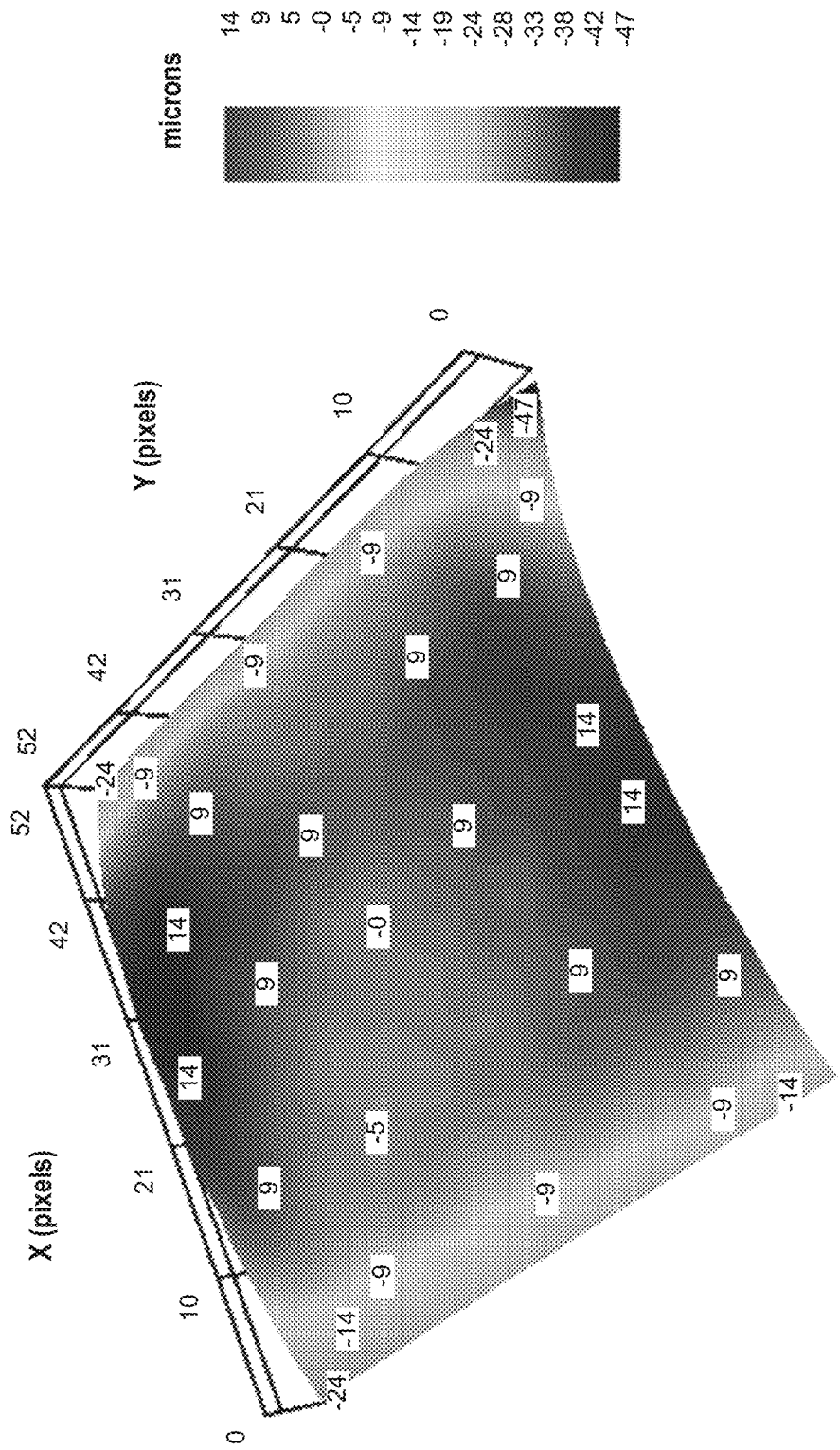

FIG. 4G includes a plot that illustrates a y-pipe positive classification. The y-pipe positive is characterized by the positive slope direction along the center region of the y-axis and the negative slope direction along both ends of the y-axis outwardly from the positive slope direction of the center region. The y-pipe positive classification and the y-pipe negative classification can be characterized according to Equation 8, with positive or negative orientation being determined visually:

$$\text{ABS}\left(\frac{fn^{1.5}}{em^{1.5}}\right) \geq 2.5; \quad \text{Equation 8}$$

where m, n correspond to values of x, y dimensions, respectively.

Figure 4H:
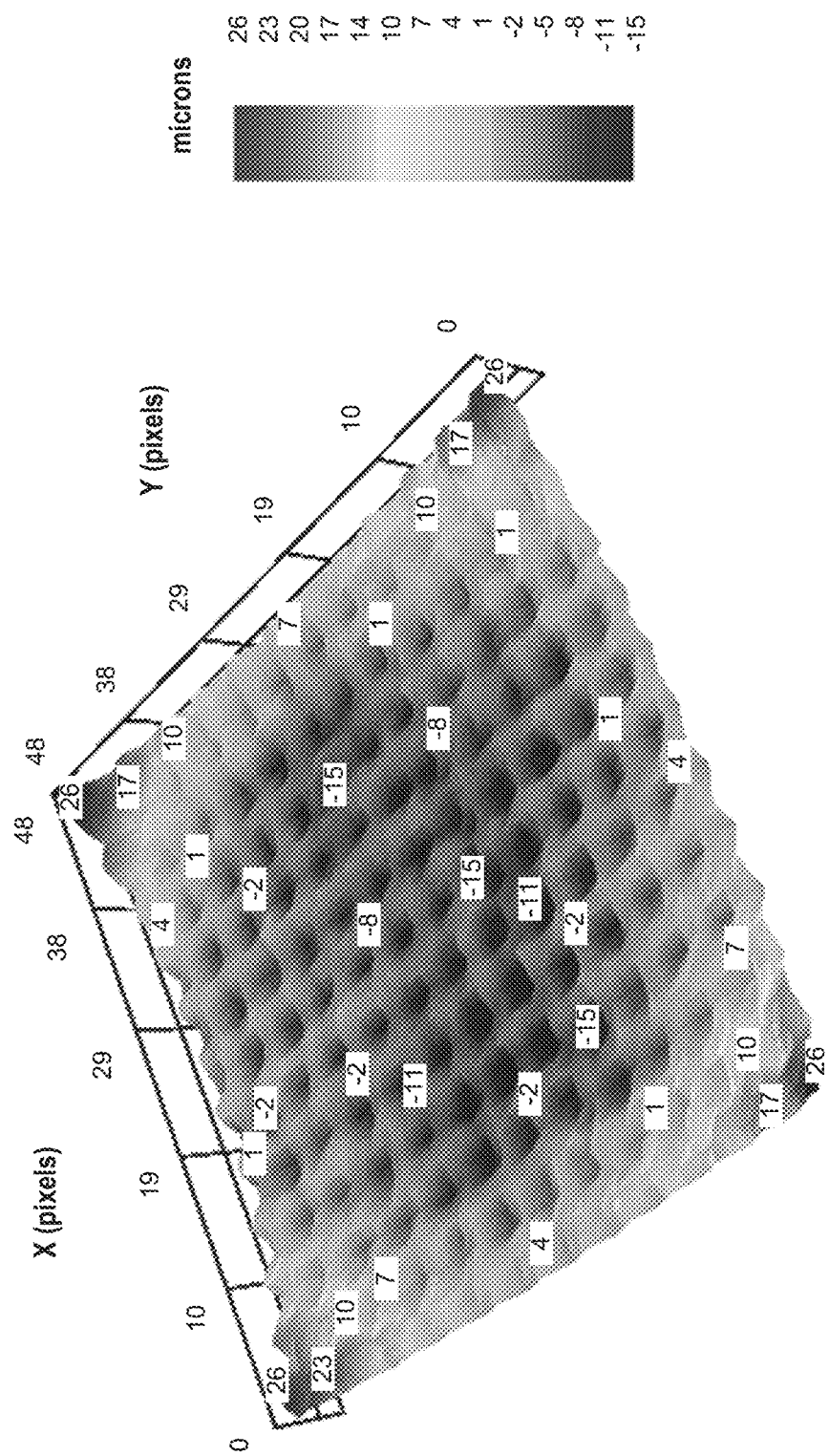

FIG. 4H includes a plot that illustrates a bowl classification. The bowl is characterized by a negative slope direction in the center region of the plot, surrounded by an increasing slope direction around the center region. The bowl classification can be characterized according to Equation 9:

$$\text{ABS}\left(\frac{fn^{1.5}}{em^{1.5}}\right) > 2.5 \text{ and } \text{ABS}\left(\frac{em^{1.5}}{fn^{1.5}}\right) < 2.5 \text{ and } e>0 \text{ and } f>0; \quad \text{Equation 9}$$

where m, n correspond to values of x, y dimensions, respectively.

Figure 4I:
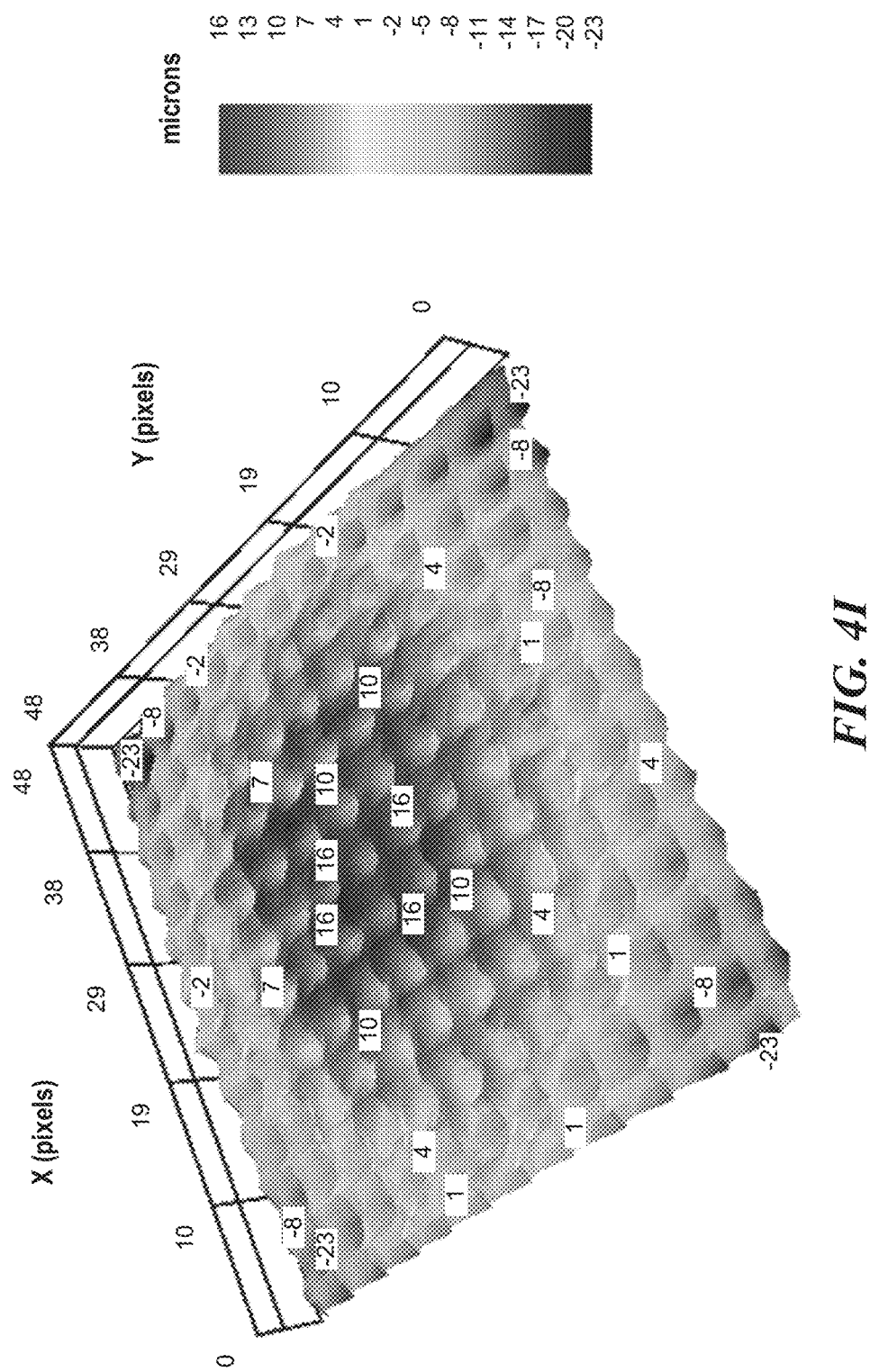

FIG. 4I includes a plot that illustrates a dome classification. The dome is generally opposite the bowl classification, and is characterized by a positive slope direction in the center region of the plot, surrounded by a decreasing slope direction around the center region. The dome classification can be characterized according to Equation 10:

$$\text{ABS}\left(\frac{fn^{1.5}}{em^{1.5}}\right) > 2.5 \text{ and } \text{ABS}\left(\frac{em^{1.5}}{fn^{1.5}}\right) < 2.5 \text{ and } e < 0 \text{ and } f < 0;$$

Equation 10 where m, n correspond to values of x, y dimensions, respectively.

Figure 4J:
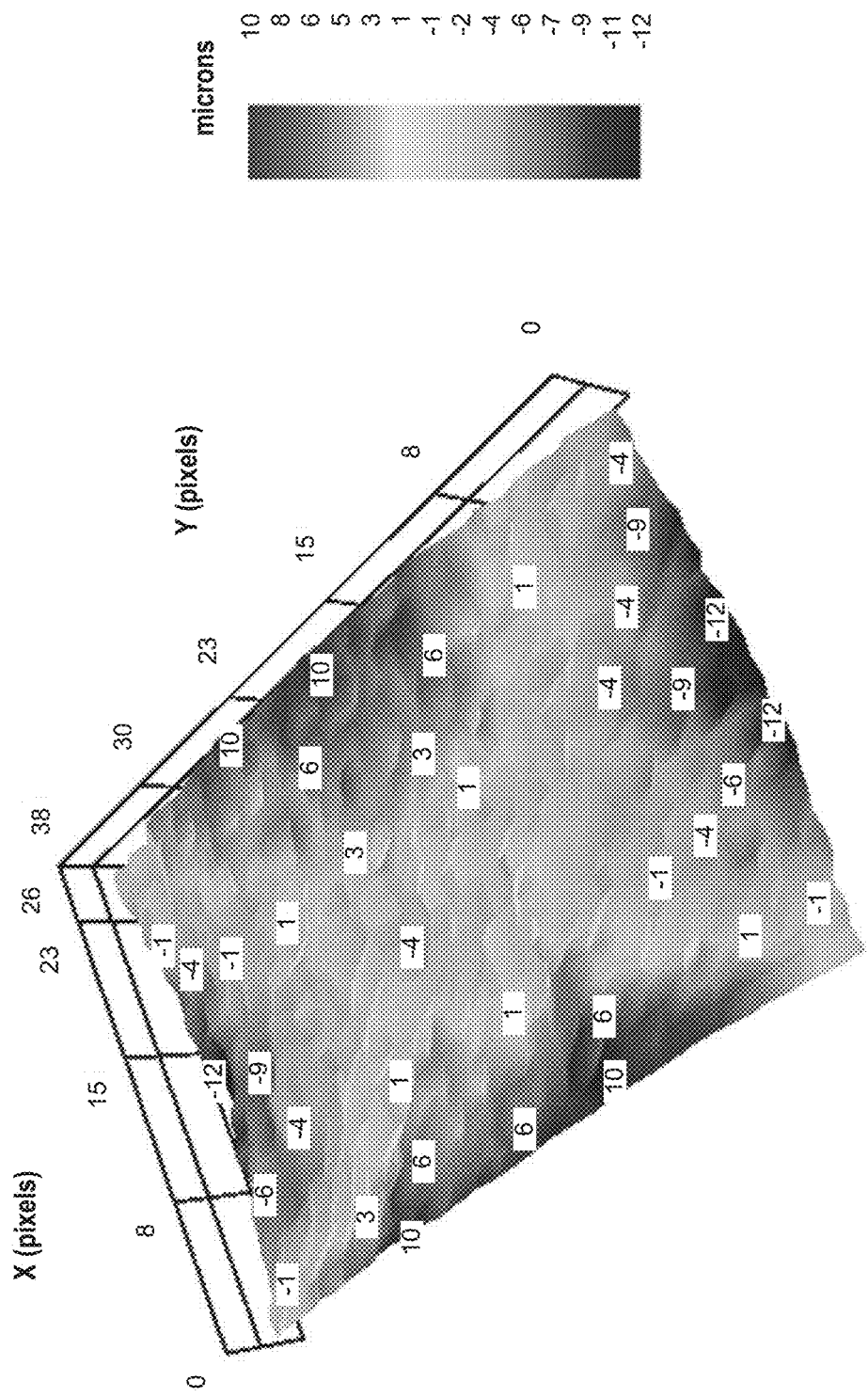

FIG. 4J includes a plot that illustrates an x-saddle classification. The x-saddle is characterized by its multiple transitions, and includes a generally flat center region with an outwardly increasing positive slope in the x-axis direction and an outwardly decreasing negative slope in the y-axis direction. The x-saddle classification can be characterized according to Equation 11:

$$\text{ABS}\left(\frac{fn^{1.5}}{em^{1.5}}\right) > 2.5 \text{ and } \text{ABS}\left(\frac{em^{1.5}}{fn^{1.5}}\right) < 2.5 \text{ and } e > 0 \text{ and } f < 0;$$

Equation 11 where m, n correspond to values of x, y dimensions, respectively.

Figure 4K:
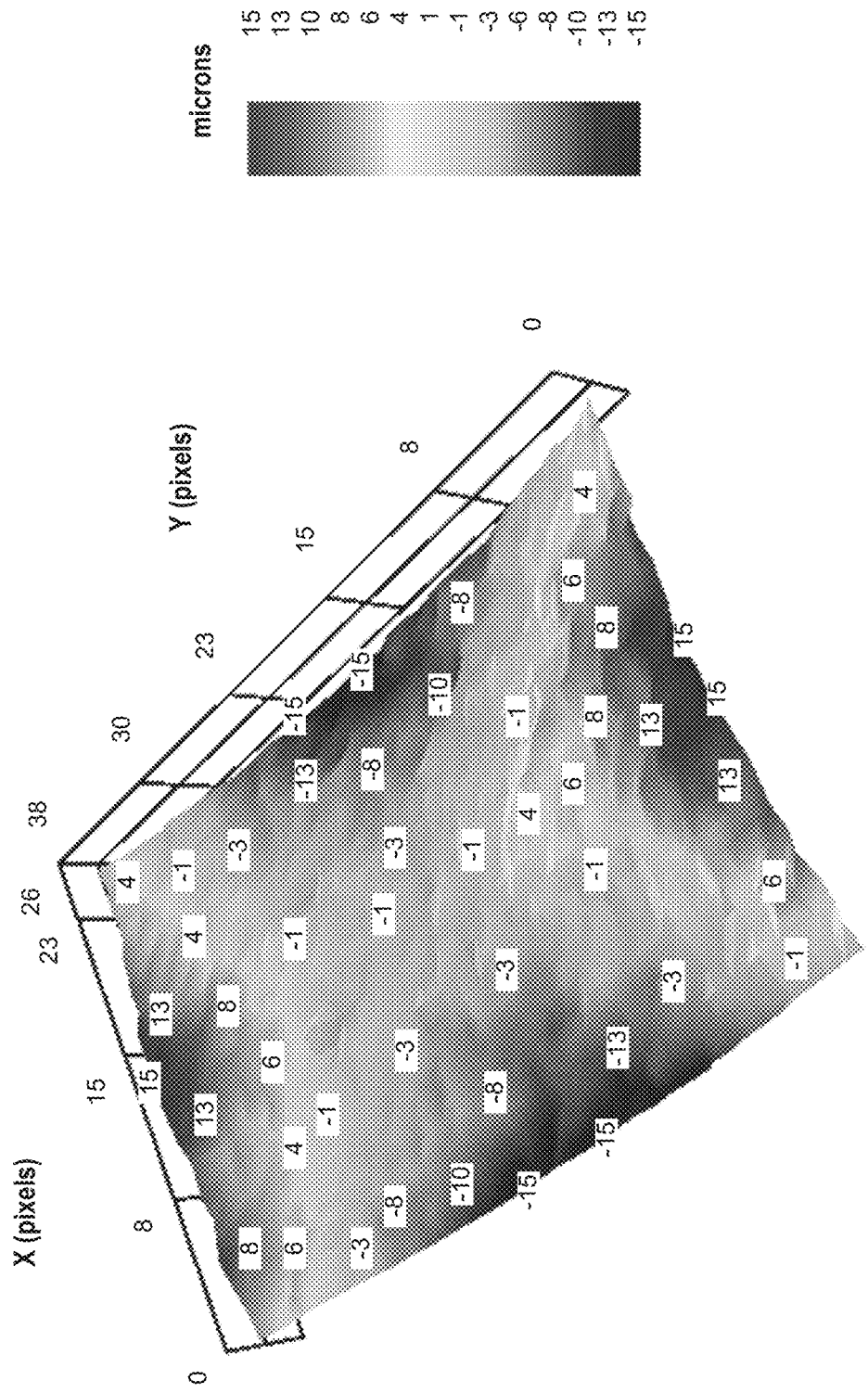

FIG. 4K includes a plot that illustrates a y-saddle classification. The y-saddle is generally opposite the x-saddle classification, and is characterized by its multiple transitions. The y-saddle includes a generally flat center region with an outwardly increasing positive slope in the y-axis direction and an outwardly decreasing negative slope in the x-axis direction. The x-saddle classification can be characterized according to Equation 12:

$$\text{ABS}\left(\frac{fn^{1.5}}{em^{1.5}}\right) > 2.5 \text{ and } \text{ABS}\left(\frac{em^{1.5}}{fn^{1.5}}\right) < 2.5 \text{ and } e < 0 \text{ and } f > 0;$$

Equation 12 where m, n correspond to values of x, y dimensions, respectively.

An advantage of these many classifications and the ability to characterize (e.g., automatically characterize) semiconductor devices is the ability to better identify and remediate the causes of warpage, or to take appropriate steps to correct or compensate for the identified type of warpage. For example, the semiconductor devices having particular classifications can be monitored to determine warpage compatibilities between two contacting surfaces, and future semiconductor devices having those classifications can be flagged. Additionally, success or failure rates of particular classifications can be used as feedback to identify and more accurately predict whether a semiconductor device should become operational or be discarded. As such, manufacturers can thereby decrease the number of passing semiconductor devices that are currently being discarded but may not need to be, and better ensure that faulty semiconductor devices do not become operational.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising," "including," and "having" are used throughout to mean including at least the recited feature(s) such that any greater number of the same feature and/or additional types of other features are not precluded. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A method for testing warpage of a semiconductor, the method comprising:
    heating or cooling the semiconductor from a first temperature to a second temperature;
    determining surface warpage data at a plurality of points on a surface of the semiconductor at a plurality of sample temperatures while the semiconductor transitions from the first temperature to the second temperature; and
    determining whether warpage of the semiconductor exceeds or falls below a threshold limit at least based on collaboratively considering the surface warpage data for the plurality of sample temperatures.

2. The method of claim 1 wherein collaboratively considering the surface warpage data includes implementing a multivariate Hotelling $T^2$ analysis to generate a Hotelling $T^2$ statistic corresponding to the warpage of the semiconductor.

3. The method of claim 2 wherein determining whether warpage of the semiconductor exceeds or falls below the threshold limit includes comparing the multivariate $T^2$ statistic for the semiconductor to the threshold limit.

4. The method of claim 1 wherein collaboratively considering the surface warpage data includes applying a principle components analysis by applying a multivariate statistical analysis to only a portion of the plurality of points on the surface of the semiconductor.

5. The method of claim 1 wherein collaboratively considering the surface warpage data includes comparing the surface warpage data of the semiconductor at each of the plurality of sample temperatures to a corresponding baseline mean of other surface warpage data at the sample temperatures for a different semiconductor.

6. The method of claim 1 wherein determining surface warpage data includes using a distance measurement device to determine distances from the distance measurement device to the plurality of points on the surface of the semiconductor.

7. The method of claim 1 wherein the threshold limit is determined based on a beta ($\beta$) distribution of the surface warpage data of the semiconductor and other semiconductor devices of a same part type as the semiconductor.

8. The method of claim 1, further comprising:
based on the surface warpage data, characterizing the semiconductor as one of a pre-determined set of classifications.

9. The method of claim 8 wherein characterizing the semiconductor includes characterizing the semiconductor using a second order or higher polynomial.

10. The method of claim 1, further comprising:
discarding the semiconductor if the warpage determined by collaboratively considering the surface warpage data exceeds the threshold limit.

11. The method of claim 1, further comprising:
discarding the semiconductor if the warpage determined by collaboratively considering the surface warpage data falls below the threshold limit.

12. The method of claim 1 wherein the first temperature is within a first range from 15° C. to 30° C. and the second temperature is within a second range from 200° C. to 300° C., the method further comprising:
cooling the semiconductor from the second temperature to a third temperature within the first range,
wherein determining the surface warpage data includes determining the surface warpage data at the plurality of points on the surface of the semiconductor as the semiconductor is being heated to the second temperature and cooled to the third temperature.

13. The method of claim 1, further comprising:
processing the semiconductor based at least in part on the determined surface warpage data.

14. A system for testing warpage of a semiconductor, the system comprising:
a chamber including a heater and/or a cooler that are respectively configured to heat and/or cool the semiconductor having a surface;
a camera positioned over the semiconductor; and
a controller in electrical communication with the camera, wherein the controller is configured to—
operate the heater and/or the cooler to transition from a first temperature to a second temperature, thereby changing a temperature of the semiconductor;
determine, via the camera, warpage data (a) at points on the surface of the semiconductor and (b) at a plurality of sample temperatures while the semiconductor transitions from the first temperature to the second temperature; and
determine whether warpage of the semiconductor exceeds or falls below a threshold limit at least based on collaboratively considering the warpage data for the plurality of sample temperatures.

15. The system of claim 14 wherein the warpage data is collaboratively considered according to a Hotelling $T^2$ analysis, wherein the controller is further configured to:
determine a Hotelling $T^2$ statistic based on the Hotelling $T^2$ analysis that corresponds to the warpage of the semiconductor.

16. The system of claim 14 wherein collaboratively considering the warpage data includes analyzing the warpage data at the plurality of sample temperatures by comparing the warpage data of the semiconductor to warpage data of a different semiconductor, at each of the plurality of sample temperatures.

17. A method for testing a semiconductor, the method comprising:
heating or cooling a plurality of semiconductors from a first temperature to a second temperature;
determining surface warpage data for the semiconductors (a) at a plurality of points on the surface of each of the semiconductors and (b) at a plurality of sample temperatures while the semiconductor transitions from the first temperature to the second temperature;
collaboratively considering the surface warpage data to generate a multivariate measure at the sample temperatures of each of the semiconductors; and
determining whether warpage of one or more of the semiconductors exceed an upper threshold limit according to the multivariate measure corresponding to the one or more of the semiconductors, the upper threshold limit being determined based on a beta ($\beta$) distribution of the surface warpage data.

18. The method of claim 17, further comprising: determining a baseline mean of the semiconductors at each of the sample temperatures, wherein—
determining surface warpage data includes using a distance measurement device positioned over the semiconductors to determine distances from the distance measurement device to the points on the surfaces of the semiconductors to generate the surface warpage data, and
collaboratively considering the surface warpage data includes comparing the surface warpage data for the semiconductors to the baseline mean.

* * * * *